(12) United States Patent
Mihara et al.

(10) Patent No.: US 6,781,223 B2
(45) Date of Patent: Aug. 24, 2004

(54) SEMICONDUCTOR DEVICE HAVING A SIGNAL LEAD EXPOSED ON THE UNDERSURFACE OF A SEALING RESIN WITH AN AIR GAP BETWEEN THE SIGNAL LEAD AND A MOUNTING SUBSTRATE

(75) Inventors: Takayuki Mihara, Satsuma (JP); Yuji Akasaki, Satsuma (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/146,904

(22) Filed: May 17, 2002

(65) Prior Publication Data

US 2003/0102550 A1 Jun. 5, 2003

(30) Foreign Application Priority Data

Nov. 30, 2001 (JP) ......................................... 2001-367309

(51) Int. Cl.⁷ .......................... H01L 23/50; H01L 29/41; H01L 23/48; C23C 14/14
(52) U.S. Cl. ........................ 257/684; 257/796; 257/788; 257/693; 257/691; 257/696; 257/698; 257/786; 257/784; 257/666; 361/808; 361/813
(58) Field of Search ................................. 257/684, 796, 257/788, 693, 691, 696, 698, 786, 784, 666, 692, 7.25; 361/808, 813

(56) References Cited

U.S. PATENT DOCUMENTS

| | | | | |
|---|---|---|---|---|
| 5,637,914 A | * | 6/1997 | Tanaka et al. | 257/666 |
| 6,191,494 B1 | * | 2/2001 | Ooyama et al. | 257/796 |
| 6,285,075 B1 | * | 9/2001 | Combs et al. | 257/675 |
| 6,441,502 B2 | * | 8/2002 | Yamada et al. | 257/786 |
| 2002/0140061 A1 | * | 10/2002 | Lee | 257/666 |
| 2002/0145180 A1 | * | 10/2002 | Terui et al. | 257/666 |
| 2003/0160323 A1 | * | 8/2003 | Tong et al. | 257/737 |

FOREIGN PATENT DOCUMENTS

| | | |
|---|---|---|
| JP | 1-202853 | 8/1989 |
| JP | 9-134982 | 5/1997 |
| JP | 10-79448 | 3/1998 |

* cited by examiner

Primary Examiner—Alexander Oscar Williams
(74) Attorney, Agent, or Firm—Westerman, Hattori, Daniels & Adrian, LLP

(57) ABSTRACT

This semiconductor device comprises a semiconductor chip, a signal lead connected to a signal electrode of the semiconductor chip, an external signal electrode connected with the signal lead, a ground lead extending along the signal lead, and a sealing resin sealing these elements. The external signal electrode is formed as a protruding electrode protruding from an undersurface of the sealing resin. One surface of the signal lead is exposed on the undersurface of the sealing resin.

9 Claims, 4 Drawing Sheets

SEMICONDUCTOR DEVICE HAVING A SIGNAL LEAD EXPOSED ON THE UNDERSURFACE OF A SEALING RESIN WITH AN AIR GAP BETWEEN THE SIGNAL LEAD AND A MOUNTING SUBSTRATE

BACKGROUND OF THE INVENTION

1. Field of the Invention

The present invention generally relates to a semiconductor device, and more particularly, to a semiconductor device dealing with a high-frequency signal including a microwave.

Conventionally, a ceramic package has been mainly used as a package for a semiconductor device dealing with a microwave. Recently, however, a resinous package has been put to use even for such a semiconductor device dealing with a microwave. Additionally, such a semiconductor device dealing with a microwave, which per se has become highly multifunctional and operative at high speed, requires a package suitable therefor.

2. Description of the Related Art

Japanese Laid-Open Patent Application No. 1-202853 discloses a high-frequency-adapted mold-package semiconductor device in which impedances of an exposed portion and an unexposed portion of a lead are matched. This semiconductor device is a semiconductor device of a small outline package (SOP) type in which the lead extends from a side surface of a resinous package portion.

In the above-mentioned semiconductor device, a characteristic impedance of the exposed portion of the lead (a part extending from the resinous package) and a characteristic impedance of the unexposed portion of the lead (a part embedded in the resinous package) are matched by adjusting a form or an arrangement of the lead so as to prevent a microwave from reflecting at a boundary part between the exposed portion and the unexposed portion.

Additionally, in a microwave-adapted semiconductor device, ground leads need to be provided at both sides of a lead used for a high-frequency signal. That is, providing external ground electrodes at both sides of an external electrode used for a high-frequency signal prevents an interference by the high frequency while keeping the semiconductor device small.

In the above-described semiconductor device disclosed in Japanese Laid-Open Patent Application No. 1-202853, the lead must have a complicated form so as to match the characteristic impedance of the exposed portion and the characteristic impedance of the unexposed portion.

In addition, upon connecting the above-described semiconductor device to a printed substrate, etc., differences in relative dielectric constants of materials composing the printed substrate cause a need for readjusting the characteristic impedances. For example, when the impedances are matched on the assumption that the semiconductor device is connected to a ceramic substrate, and thereafter the ceramic substrate is changed to an epoxy substrate, the impedances have to be readjusted.

Specifically, when the relative dielectric constant of the material composing the printed substrate contacting the exposed portion changes, the impedance of the exposed portion also changes so as not to match the impedance of the unexposed portion. Thereupon, in order to adjust the impedance of the exposed portion of the lead in consideration of the relative dielectric constant of the printed substrate, a lead frame per se needs to be redesigned.

Additionally, since the unexposed portion is surrounded by a sealing resin, the unexposed portion of the lead is affected by a characteristic of the sealing resin. Especially, with respect to a lead transmitting a microwave, a transmission characteristic becomes aggravated depending on a type of the sealing resin.

SUMMARY OF THE INVENTION

It is a general object of the present invention to provide an improved and useful semiconductor device in which the above-mentioned problems are eliminated.

A more specific object of the present invention is to provide a semiconductor device in which an impedance of a lead is not affected by a material composing a mounting substrate, and an influence of a sealing resin to a transmission characteristic can be reduced.

In order to achieve the above-mentioned objects, there is provided according to one aspect of the present invention a semiconductor device comprising:

a semiconductor chip;

a signal lead connected to a signal electrode of the semiconductor chip;

an external signal electrode connected with the signal lead;

a ground lead extending along the signal lead; and a sealing resin sealing the semiconductor chip, the signal lead, the external signal electrode and the ground lead, wherein the external signal electrode is formed as a protruding electrode protruding from an undersurface of the sealing resin, and one surface of the signal lead is exposed on the undersurface of the sealing resin.

According to the present invention, one surface of the signal lead is exposed on the undersurface of the sealing resin, and the external signal electrode is formed as a protruding electrode; therefore, when the semiconductor device is mounted on a mounting substrate, an air gap is formed between the signal lead and the mounting substrate. Thereby, the exposed signal lead does not contact the mounting substrate, and thus, an impedance of the signal lead does not change by being affected by a material forming the mounting substrate. Accordingly, even when the material forming the mounting substrate is changed, the same semiconductor device remains usable. In addition, since only one surface of the signal lead contacts the sealing resin, a signal transmission loss due to the sealing resin can be reduced, in comparison with a case in which both surfaces of the signal lead contact the sealing resin.

Additionally, the semiconductor device according to the present invention may further comprise a ground electrode provided under the semiconductor chip, the ground electrode protruding at a same height as the external signal electrode protrudes on the undersurface of the sealing resin.

According to the present invention, the semiconductor device can be connected to a mounting substrate, not only by the external signal electrode arranged in an outer peripheral part of the semiconductor device, but also by the ground electrode positioned under the semiconductor chip.

Additionally, in the semiconductor device according to the present invention, the ground electrode may be formed larger than an outer shape of the semiconductor chip, and a ground electrode of the semiconductor chip may be connected to the ground electrode by a bonding wire.

According to the present invention, the ground electrode of the semiconductor chip can be grounded to the ground electrode positioned nearby so as to achieve an excellent grounding effect.

Additionally, the semiconductor device according to the present invention may further comprise an external ground electrode adjacent to the external signal electrode.

According to the present invention, a part neighboring the external signal electrode can be grounded so as to achieve an excellent grounding effect.

Additionally, the semiconductor device according to the present invention may further comprise an outer peripheral ground portion provided in a periphery of the external signal electrode, wherein the ground lead extends along the signal lead from the ground electrode to the outer peripheral ground portion.

According to the present invention, peripheries of the signal lead and the external signal electrode are completely encompassed by the ground lead and the outer peripheral ground portion so as to achieve an excellent shield effect.

Additionally, in the semiconductor device according to the present invention, the ground electrode of the semiconductor chip may be connected to the ground lead by the bonding wire.

According to the present invention, a connecting point of the bonding wire can be changed along the ground lead so as to adjust a length of the bonding wire connected to the ground electrode.

In order to achieve the above-mentioned objects, there is provided according to another aspect of the present invention a semiconductor device comprising:

a semiconductor chip;

signal leads connected to signal electrodes of the semiconductor chip;

external signal electrodes connected with the signal leads;

at least one ground lead extending along only a signal lead transmitting a high-frequency signal, among the signal leads; and a sealing resin sealing the semiconductor chip, the signal leads, the external signal electrodes and the ground lead, wherein each of the external signal electrodes is formed as a protruding electrode protruding from an undersurface of the sealing resin, and one surface of each of the signal leads is exposed on the undersurface of the sealing resin.

According to the present invention, the ground lead is not provided for a signal lead not transmitting a high-frequency signal. Therefore, unnecessary ground leads are not formed, and thus a size of the semiconductor device can be reduced to that extent.

Additionally, in the semiconductor device according to the present invention, a characteristic impedance of the signal lead may be so adjusted that an input-output impedance of the semiconductor chip matches an impedance of an external circuit connected to the signal lead via the external signal electrode.

According to the present invention, a high-frequency signal can be efficiently supplied from the external circuit to the semiconductor chip.

Additionally, in the semiconductor device according to the present invention, the characteristic impedance may be adjusted by adjusting a wire diameter of each of bonding wires connected to the signal electrode and a ground electrode of the semiconductor chip and adjusting an interval between the bonding wires.

According to the present invention, a high-frequency signal can be efficiently supplied from the external circuit to the semiconductor chip.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 1:
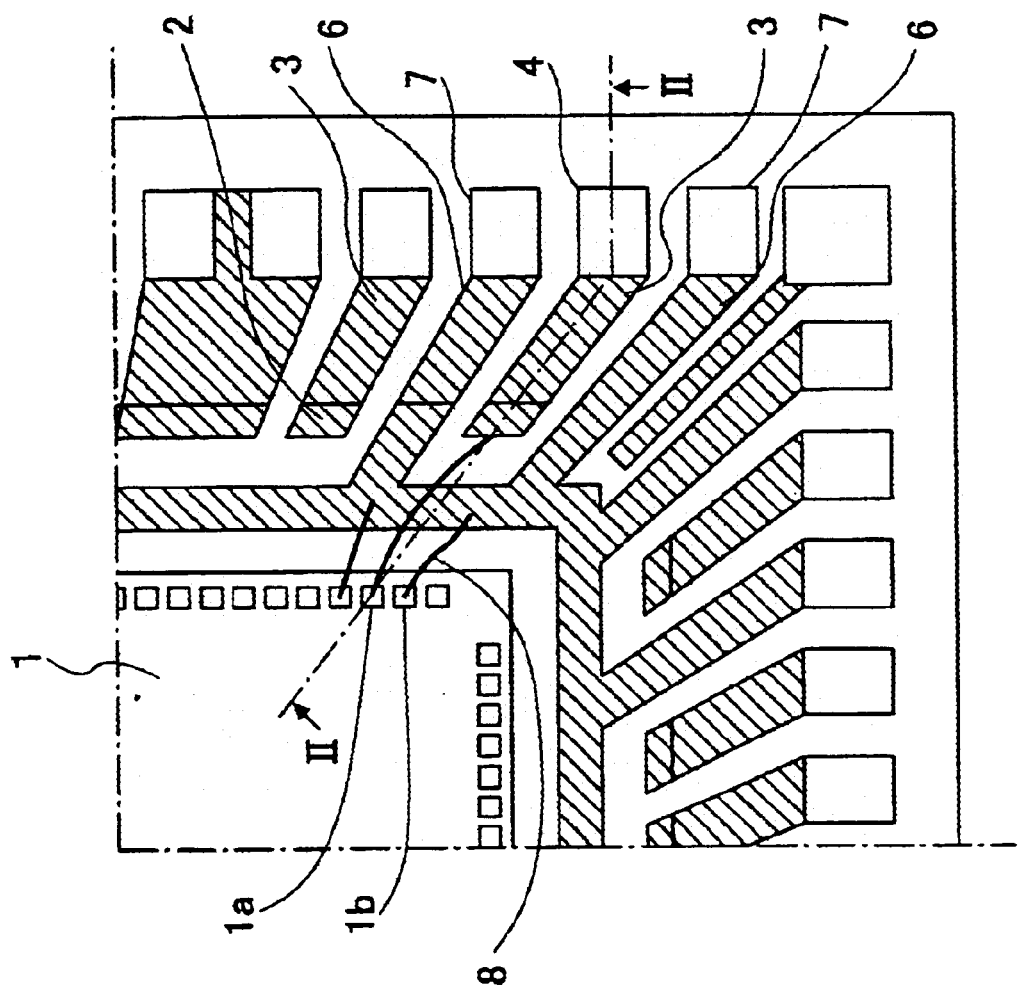
FIG. 1 is a perspective plan view of a semiconductor device according to a first embodiment of the present invention.
Figure 2:
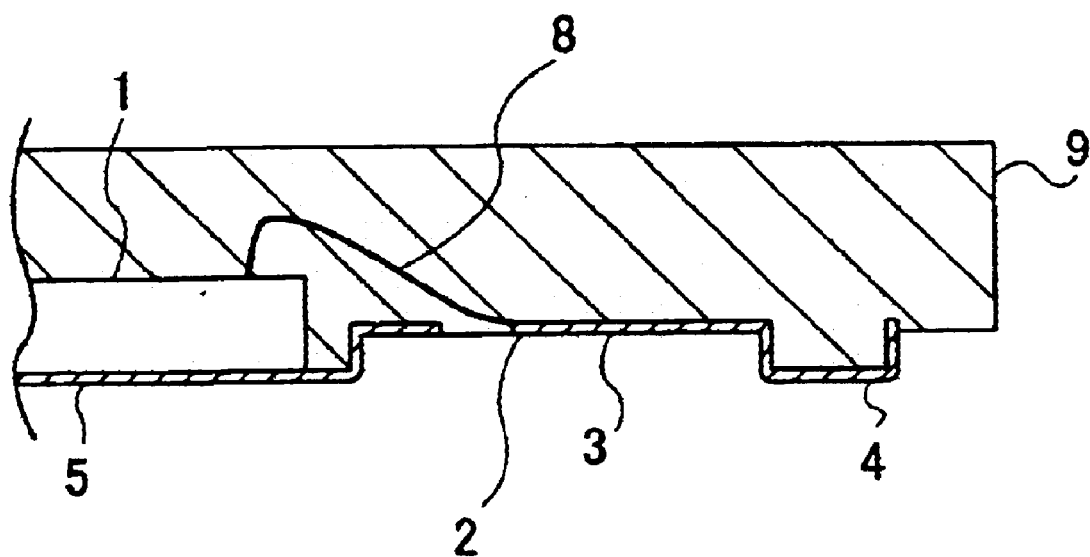
FIG. 2 is a sectional view taken along a line II—II in FIG. 1.

FIG. 1 is a perspective plan view of a semiconductor device according to a first embodiment of the present invention. For the purpose of simplifying the view, FIG. 1 shows only one quarter of the semiconductor device. FIG. 2 is a sectional view taken along a line II—II in FIG. 1.

The semiconductor device according to the first embodiment of the present invention is a semiconductor device of a leadless package type in which an external connection terminal, such as a signal terminal, is formed as a protruding electrode. The semiconductor device according to the first embodiment has a basic structure as a leadless package which is similar to a semiconductor device disclosed in Japanese Laid-Open Patent Application No. 10-79448.

The semiconductor device shown in FIG. 1 comprises a semiconductor chip 1, internal electrodes 2, signal leads 3, external signal electrodes 4, a ground electrode 5, ground leads 6, external ground electrodes 7, and bonding wires 8, and has a package structure in which these components are sealed by a sealing resin 9.

As shown in FIG. 2, the semiconductor chip 1 is mounted on the ground electrode 5. The ground electrode 5 extends in a periphery of the semiconductor chip 1. The ground lead 6 extends from a periphery of the ground electrode 5, and is connected to the external ground electrode 7. The external ground electrodes 7 are arranged at both sides of each of the external signal electrodes 4 supplied with a microwave signal. The ground leads 6 are arranged at both sides of each of the signal leads 3 supplied with the microwave signal.

The internal electrode 2 connected with the signal lead 3 is connected to a signal electrode 1a of the semiconductor chip 1 by the bonding wire 8. A ground electrode 1b of the semiconductor chip 1 is connected to the ground electrode 5 by the bonding wire 8.

As shown in FIG. 2, the external signal electrode 4 is formed as a protruding electrode at the undersurface of the sealing resin 9. The signal lead 3 extending from the external signal electrode 4 and the internal electrode 2 connected with the signal lead 3 are exposed on the undersurface of the sealing resin 9. In other words, the signal lead 3 and the internal electrode 2 are covered with the sealing resin 9 only at one surface, and are exposed from the sealing resin 9 at the other surface.

Also, the ground electrode 5 is exposed from the undersurface of the sealing resin 9 in a protruding form. A protruding height of the ground electrode 5 is equal to a protruding height of the external signal electrode 4 formed as the protruding electrode. Though not shown in the figures, the external ground electrode 7 is also formed as a protruding electrode in the same manner as the external signal electrode 4, and the ground lead 6 is also exposed on the undersurface of the sealing resin 9.

Upon mounting the semiconductor device structured as above on a mounting substrate, the external signal electrode 4, the external ground electrode 7 and the ground electrode 5 so formed as to protrude from the undersurface of the sealing resin 9 are joined to electrode pads formed on the mounting substrate. Thus, the semiconductor device is mounted on the mounting substrate such that the signal lead 3 and the internal electrode 2 are spaced from a surface of the mounting substrate, i.e., an air gap is formed between the signal lead 3/the internal electrode 2 and the mounting substrate.

Therefore, a characteristic impedance of a signal transmission path formed by the signal lead 3 supplied with the microwave, the internal electrode 2 and so forth is not affected by a material forming the mounting substrate. Accordingly, changing the material forming the mounting substrate entails no need for changing the impedance by varying a form and an arrangement of the signal lead 3 or for redesigning the semiconductor device.

In addition, the signal lead 3 and the internal electrode 2 are covered with the sealing resin 9 only at one surface, and are exposed at the other surface; therefore, a transmission loss of the microwave due to the sealing resin 9 contacting the signal lead 3 and the internal electrode 2 can be reduced, in comparison with a conventional semiconductor device covered with a sealing resin at both surfaces.

It is known that a transmission loss due to an influence of a sealing material depends on a value of a dielectric loss tangent of the sealing material such that, when the value of the dielectric loss tangent is small, the influence is small. For example, the value of the dielectric loss tangent is the order of 0.01 for a resinous sealing material, and is the order of 0.001 for a ceramic material having an excellent high-frequency characteristic. Additionally, the value of the dielectric loss tangent is substantially zero for air. Accordingly, replacing the expensive ceramic material with the resinous material increases the transmission loss; however, in the present invention, exposing the signal lead 3 and the internal electrode 2 at one surface can suppress the increase in the transmission loss with respect to the microwave.

In the above-described semiconductor device, adjusting the characteristic impedance by modifying a form and an arrangement of a part consisting of the internal electrode 2, the signal lead 3 and the external signal electrode 4 enables an input-output impedance of the semiconductor chip 1 to match an impedance of an external circuit.

For instance, a characteristic impedance of an external circuit of the mounting substrate connected to the external signal electrode 4 is assumed to be 50 Ω, and the input-output impedance of the semiconductor chip 1 is assumed to be 100 Ω. In this instance, a lead pattern is so modified that a characteristic impedance of the signal lead 3 in the proximity of the internal electrode 2 becomes 100 Ω, and that a characteristic impedance of the signal lead 3 in the proximity of the external signal electrode 4 becomes 50 Ω. In other words, the lead pattern is so modified that the characteristic impedance of the signal lead 3 decreases gradually. This enables the input-output impedance of the semiconductor chip 1 to match the characteristic impedance of the external circuit.

Also, as for the bonding wire 8, adjusting a characteristic impedance thereof in the same manner as for the signal lead 3 enables a high-frequency characteristic to be further improved. Specifically, modifying a wire diameter of the bonding wire 8 or an interval between the adjacent bonding wires 8 realizes a desired characteristic impedance.

Figure 3:
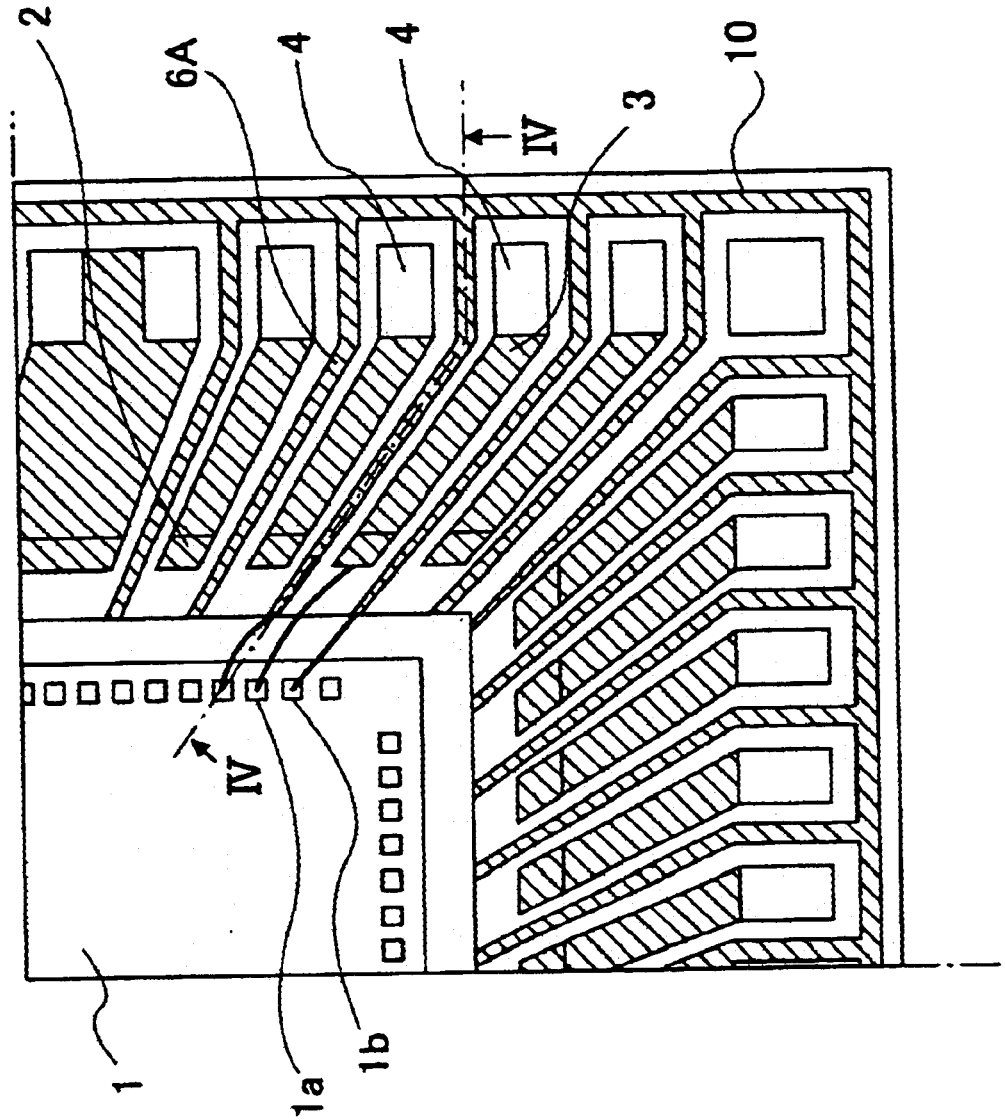
FIG. 3 is a perspective plan view of a semiconductor device according to a second embodiment of the present invention.
Figure 4:
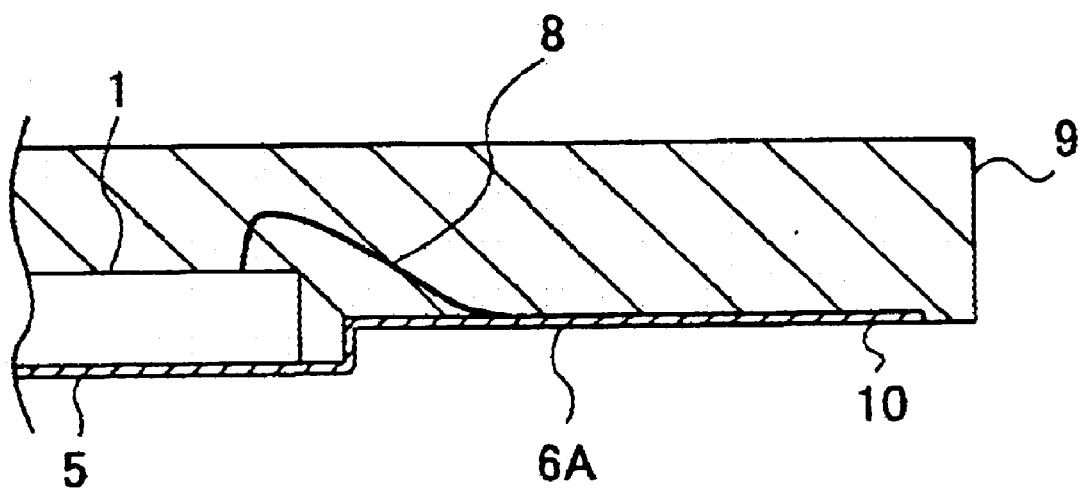
FIG. 4 is a sectional view taken along a line IV—IV in FIG. 3.

Next, a description will be given, with reference to FIG. 3 and FIG. 4, of a semiconductor device according to a second embodiment of the present invention. FIG. 3 is a perspective plan view of the semiconductor device according to the second embodiment of the present invention. For the purpose of simplifying the view, FIG. 3 shows only one quarter of the semiconductor device. FIG. 4 is a sectional view taken along a line IV—IV in FIG. 3.

The semiconductor device according to the second embodiment of the present invention comprises the signal leads 3 and the external signal electrodes 4 structured in the same manner as in the above-described semiconductor device according to the first embodiment, but has ground leads structured differently. As shown in FIG. 3, in the present embodiment, an outer peripheral ground portion 10 is provided outside the external signal electrodes 4, and ground leads 6A extend between the ground electrode 5 and the outer peripheral ground portion 10. The ground electrode 1b of the semiconductor chip 1 is connected to each of the ground leads 6A by the bonding wire 8.

In the present embodiment, the external ground electrodes (7) adjacent to the external signal electrodes 4 are not provided, and thus, grounding is undertaken solely by the ground electrode 5. Therefore, the number of electrodes formed in the semiconductor device can be decreased so that a size of the semiconductor device as a whole can be reduced. Additionally, outer peripheries of the signal leads 3 and the external signal electrodes 4 can be completely encompassed by the ground leads 6A and the outer peripheral ground portion 10 so that the signal leads 3 and the external signal electrodes 4 are shielded.

The present invention is not limited to the specifically disclosed embodiments, and variations and modifications may be made without departing from the scope of the present invention.

The present application is based on Japanese priority application No. 2001-367309 filed on Nov. 30, 2001, the entire contents of which are hereby incorporated by reference.

What is claimed is:

1. A semiconductor device comprising:
   a semiconductor chip;
   signal leads, each carrying a high frequency signal, and each being connected to a signal electrode of said semiconductor chip;
   external signal electrodes, each connected with one of said signal leads;
   ground leads, each extending along one of said signal lead and separating each of said signal leads from each other; and
   a sealing resin sealing said semiconductor chip, said signal leads, said external signal electrodes and said ground leads,
   wherein each of said external signal electrodes is formed as a protruding electrode protruding from an undersurface of said sealing resin, and one surface of each of said signal leads is exposed on the undersurface of said sealing resin.

2. The semiconductor device as claimed in claim 1, further comprising a ground electrode provided under said semiconductor chip, said ground electrode protruding at a same height as said external signal electrodes protrude on the undersurface of said sealing resin.

3. The semiconductor device as claimed in claim 2, wherein said ground electrode is formed larger than an outer shape of said semiconductor chip, and a ground electrode of said semiconductor chip is connected to said ground electrode by a bonding wire.

4. The semiconductor device as claimed in claim 2, further comprising an external ground electrode adjacent to one of said external signal electrodes.

5. The semiconductor device as claimed in claim 2, further comprising an outer peripheral ground portion provided in a periphery of said external signal electrodes, wherein said ground leads extend along said signal leads from said ground electrode to said outer peripheral ground portion.

6. The semiconductor device as claimed in claim 5, wherein said ground electrode of said semiconductor chip is connected to one of said ground leads by the bonding wire.

7. A semiconductor device comprising:

a semiconductor chip;

signal leads connected to signal electrodes of said semiconductor chip;

external signal electrodes connected with said signal leads;

at least one ground lead extending along every signal lead transmitting a high-frequency signal, among said signal leads; and a sealing resin sealing said semiconductor chip, said signal leads, said external signal electrodes and said ground lead, wherein each of said external signal electrodes is formed as a protruding electrode protruding from an undersurface of said sealing resin, and one surface of each of said signal leads is exposed on the undersurface of said sealing resin.

8. The semiconductor device as claimed in claim 1, wherein a characteristic impedance of said signal lead is so adjusted that an input-output impedance of said semiconductor chip matches an impedance of an external circuit connected to said signal lead via said external signal electrode.

9. The semiconductor device as claimed in claim 8, wherein said characteristic impedance is adjusted by adjusting a wire diameter of each of bonding wires connected to said signal electrode and a ground electrode of said semiconductor chip and adjusting an interval between said bonding wires.

* * * * *